(12) United States Patent
Yeh et al.

(10) Patent No.: US 8,541,270 B2
(45) Date of Patent: Sep. 24, 2013

(54) FINLIKE STRUCTURES AND METHODS OF MAKING SAME

(75) Inventors: Ming-Hsi Yeh, Hsin-Chu (TW);
 Chi-Ming Yang, Hsin-Chu (TW);
 Chin-Hsiang Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 24 days.

(21) Appl. No.: 13/269,107

(22) Filed: Oct. 7, 2011

(65) Prior Publication Data

US 2013/0089958 A1   Apr. 11, 2013

(51) Int. Cl.
 *H01L 21/336* (2006.01)
(52) U.S. Cl.
 USPC ................. 438/197; 438/585; 257/E21.405

(58) Field of Classification Search
 USPC ................ 438/209, 508; 257/E21.37, E21.4, 257/E21.405, E21.441, E21.449, E21.451
 See application file for complete search history.

(56) References Cited

U.S. PATENT DOCUMENTS

2008/0185691 A1 * 8/2008 Cheng et al. .................. 257/656

* cited by examiner

*Primary Examiner* — Cheung Lee
(74) *Attorney, Agent, or Firm* — Slater & Matsil, L.L.P.

(57) ABSTRACT

Semiconductor materials, particularly III-V materials used to form, e.g., a finlike structure can suffer structural damage during chemical mechanical polishing steps. This damage can be reduced or eliminated by oxidizing the damaged surface of the material and then etching away the oxidized material. The etching step can be accomplished simultaneously with a step of etching back a patterned oxide layers, such as a shallow trench isolation layer.

20 Claims, 4 Drawing Sheets

FINLIKE STRUCTURES AND METHODS OF MAKING SAME

BACKGROUND

Fin structures are becoming increasingly popular in forming advanced, small geometry semiconductor devices. One such structure is the so-called Fin-FET device wherein a device such as a metal oxide semiconductor (MOS) transistor or a bipolar junction transistor (BJT) is formed at least partially within a thin fin formed of a single crystal semiconductor material. While it is desirable to have a defect free fin for optimum device performance, various processing steps can induce damage to the crystal structure of the fin.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Various steps in the formation of a fin device will be described with reference to FIGS. 1 through 3. It should be appreciated that the materials, geometries, dimensions, structures, and process parameters described herein are exemplary only and are not intended to be, and should not be construed to be, limiting to the invention claimed herein. Many alternatives and modifications will be apparent to those skilled in the art, once informed by the present disclosure.

Figure 1A:
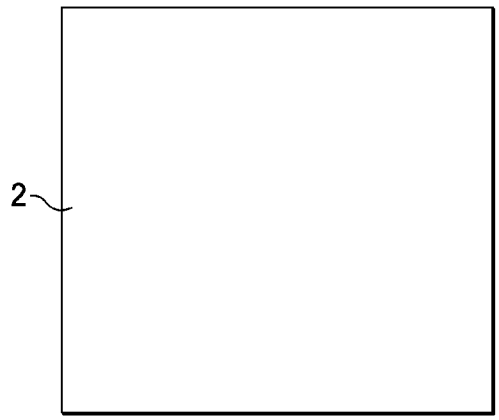
FIGS. 1a through 1h are cross sectional views of intermediate steps in the manufacture of a first embodiment device.
Figure 2A:
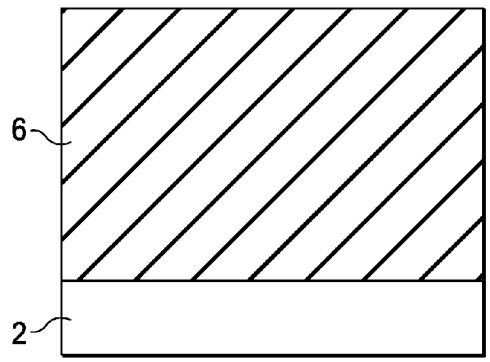
FIGS. 2a through 2e are cross sectional views of intermediate steps in the manufacture of a second embodiment device.
Figure 2B:
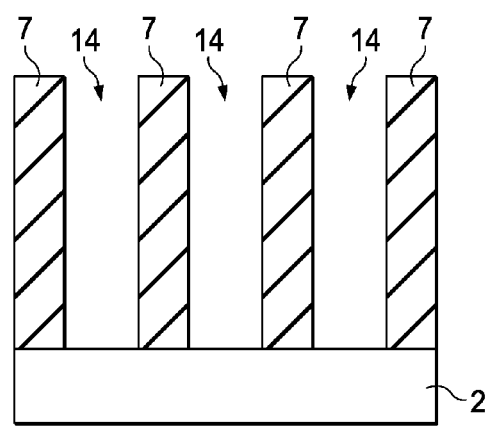

FIG. 1a illustrates a semiconductor substrate 2 that may be employed in embodiments of the present disclosure. Substrate 2 may be bulk substrate, such as a bulk silicon wafer commonly employed in CMOS manufacturing processes. Alternatively, substrate 2 may be a compound substrate, such as a silicon-on-insulator (SOI) substrate, or another bulk or compound semiconductor substrate formed of other materials such as germanium, gallium-arsenide, III-V materials, and the like. Only a portion of substrate 2 is illustrated in the figures, as this is sufficient to fully describe the illustrative embodiments.

Figure 1B:
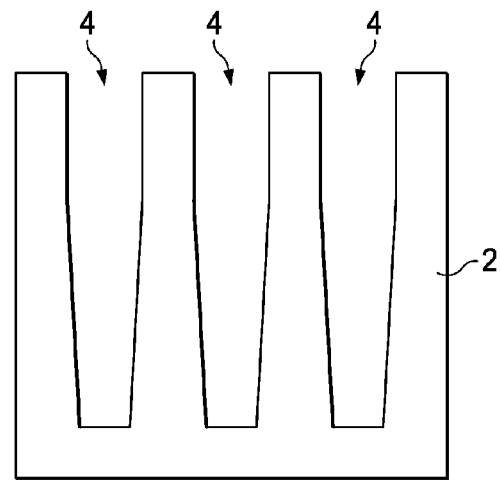

Recesses 4 are etched into substrate 2, as shown in FIG. 1b using, e.g., a dry etch process employing an $O_2$, Argon, a chloro-fluoro-carbon (CFC) such as $CF_4$, or like material as an etchant in a plasma etching process. The details of such dry etch processes are well known in the art and hence are not repeated herein.

Figure 1C:
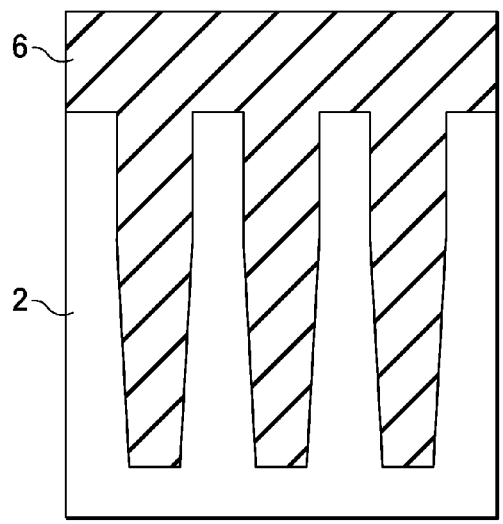

An oxide 6 is next formed over substrate 2 and filling recesses 4, as illustrated in FIG. 1c. Oxide layer 6 is also referred to as shallow trench isolation (STI) in some applications, also known as a gap fill oxide in some applications. Oxide 6 may be deposited using chemical vapor deposition (CVD) techniques. In other embodiments, oxide 6 may be a spin on glass (SOG) oxide that is spun onto the surface, or some other alternatively deposited oxide. As shown, oxide 6 is deposited to a thickness that overfills recesses 4.

Figure 1D:
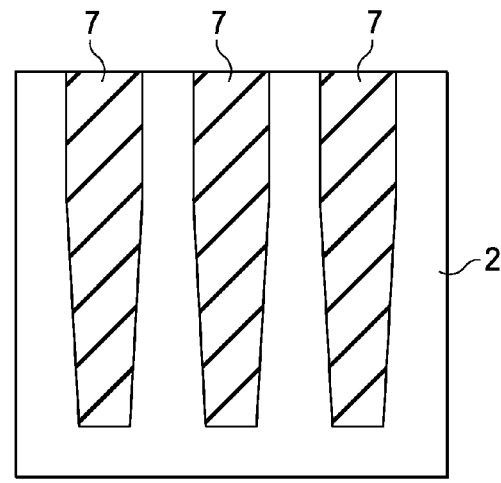

A chemical mechanical polish (CMP) step may next be employed to planarize the top surface of oxide 6 to the top of recesses 4, as illustrated in FIG. 1d. The details of the oxide CMP step are known in the art and hence are not repeated herein. As shown in FIG. 1d, after the CMP step, oxide regions 7 remain filling recesses 4 but no longer overfill the recesses.

Figure 1E:
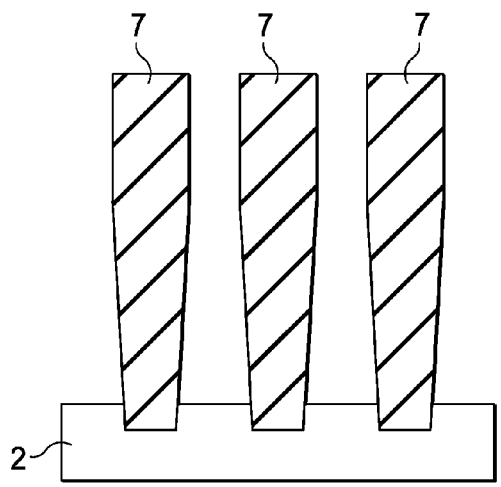

The device illustrated in FIG. 1d is then subjected to a silicon etch process, such as a wet etch using dilute hydrofluoric acid (HF). In some embodiments, the dilute HF could be about a 1% solution of HF in water. Other silicon etch processes are within the contemplated scope, as well. The structure resulting after the silicon etch process is illustrated in FIG. 1e. The portions of substrate 2 between oxide regions 7 has been etched away, leaving only oxide regions 7 that had previously filled recesses 4 and underlying substrate 2. Substrate 2 may be etched away slightly during the silicon etch process, but not appreciably relative to the thickness of substrate 2.

In a next process step, a fin material 8 is epitaxially grown on substrate 2 and around the oxide regions 7. One skilled in the art will recognize that although oxide regions 7 are shown as patterned into columnar shapes (and described as columnar herein), the illustrations are merely cross sectional views of the actual structure and the actual structure is elongated into and out of the plane of the page.

Figure 1F:
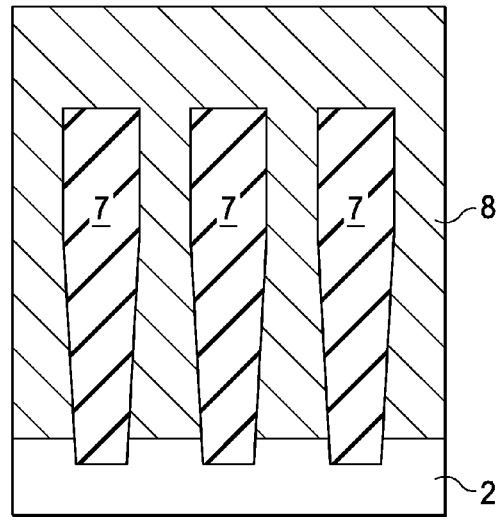

The result of this process is best illustrated in FIG. 1f. Fin material 8 may comprise Ge, SiGe, GaAs, InP, or InGaAs, as just examples. Numerous other fin materials, including other III-V material or II-VI materials suitable for integrated circuit processing, including those currently recognized and those identified in the future, are considered within the contemplated scope of the present invention. Fin material 8 may be epitaxially grown using an metal organic chemical vapor deposition (MOCVD) process, as an example. Other epitaxial growth/deposition techniques could likewise be employed. In some embodiments, fin material 8 is in situ doped with, e.g., phosphorous, antimony, arsenic, carbon, and the like, during the epitaxial growth process. As illustrated fin material 8 is grown to fill and overfill the trenches between columnar oxide 6 features.

In a subsequent processing step, fin material 8 is subject to a CMP process to planarize the top surface of fin material 8 to be planar with the tops of oxide regions 7. In one illustrative embodiment, the CMP process involves, for instance, a slurry composition of about 5% to about 20% $SiO_2$, less than about 5% $NH_4O_4$, and greater than about $H_2O_2 > 70\%$, at a slurry flow rate of from about 50 sccm to about 1,000 sccm. The CMP process may be performed at about room temperatures, say about 23 C to about 25 C for a period of time sufficient to provide the desired planarity, perhaps about 5 seconds to about 300 seconds.

Figure 1G:
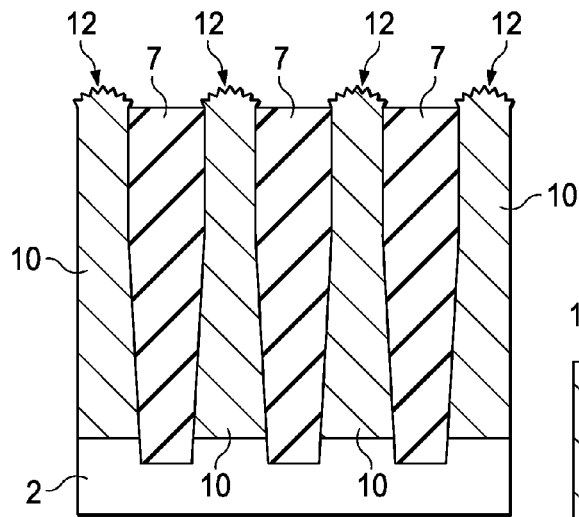

As illustrated in FIG. 1g, fin material 8 is patterned by the CMP process into a series of fin shaped elements 10. These elements may be referred to herein as fins. The top surfaces of respective fins 10 may be damaged by the CMP process. This is schematically illustrated in FIG. 1g, by the damaged regions 12. Damaged regions can be caused by several factors. One such factor is damage to the surface of fins 10 caused by the mechanical abrasion of the CMP pad. Additionally, abrasives in the CMP slurry may cause microscratches on the exposed surfaces of fins 10. Structural damage can also be caused by the chemical interaction of the fin material with the CMP slurry.

The above described structural damage to a fin 10 can adversely impact the performance of a device that is manufactured using the fin 10. For instance, dislocations in the crystal structure of fin 10 can provide a path for impurity migration, can increase leakage current, can affect threshold voltage, etc. In some instances, gate leakage could increase by 0.01 A/cm$^2$ to 100 A/cm$^2$, and threshold voltage could increase by 10 mV to 1,000 mV from the structural damage.

Figure 1H:
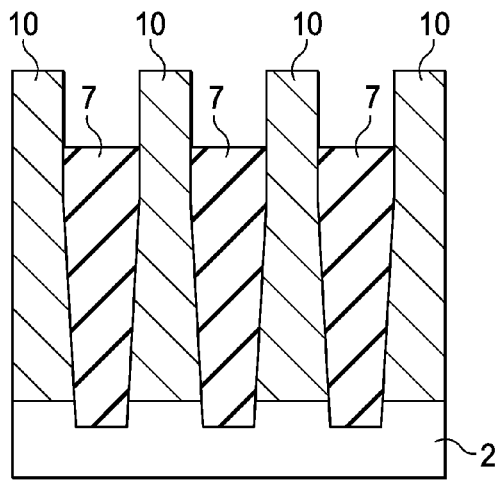

FIG. 1h illustrates the results of an etch back process wherein oxide regions 6 are recessed back from the top surfaces of fins 10. The present inventors have discovered an etch back methodology that not only recesses oxide regions 7 to a desired level, but also provides additional advantages. One such advantage is that the top surface of oxide regions 7, after the etch back process, may be substantially more flat and planar relative to oxide regions that are etched back using conventional wet etch processes. Another advantage is that the etch back process described herein will simultaneously remove the damaged regions 12 of fins 10, leaving the resulting fins substantially free from the performance degrading defects and damage schematically illustrated in FIG. 1g as damaged regions 12. The etch back methodology involves oxidizing exposed portions of fins 10 and then removing those oxidized portions while etching back the top surface of oxide regions 7.

In an illustrative embodiment, the etch back process proceeds as follows. In a first step of the process, the device is subject to an oxidizing treatment. In one specific embodiment, the oxidizing treatment comprises ozonated distilled water wherein the ozone concentration is from about 10 ppm to about 500 ppm. While the treatment may be performed at an elevated temperature, an advantageous feature of the illustrative embodiment is that the treatment may be performed at room temperature, thus preserving thermal budget. In an illustrative embodiment, the ozonated water treatment is performed for perhaps 30 to 120 seconds. It is believed that the top surface of fins 10, including damaged regions 12, are at least partially oxygenated during the ozonated water treatment. As but one example, assuming fins 10 are initially formed of GaAs, after treatment, the exposed surface of fins 10 is converted to an oxide of gallium arsenide, such as GaAsO down to a depth of about 5 Å to about 100 Å.

One advantageous feature of the oxidizing treatment is that the ozonated water (in an illustrative example, the water is ozonated from about 5 ppm to about 1,000 ppm) provides a cleaning treatment to exposed surfaces in addition to the oxidizing treatment. In some embodiments, however, other solutions may be employed for the oxidizing treatment. For instance, in some embodiments, $H_2O_2$ may be employed in addition to or in lieu of ozonated water for the oxidizing treatment. As one specific example, the oxidizing treatment comprises $H_2O_2$ at a concentration of about 1% to about 31%, a flow rate of from about 50 sccm to about 2,000 sccm, and a temperature of from about 23 C to about 40 C. Other processes will be apparent to those skilled in the art using routine experimentation, once informed by the present teaching.

In a next step of the process, the device is subject to an etch. In an illustrative embodiment, the etch is a dry, plasma free etch process using, for example, a mixture of $NH_xF$ and HF at a concentration of from about 0.005% to about 1% and a flow rate of from about 50 sccm to about 2,000 sccm. In this illustrative embodiment, the etch process is performed at a temperature in the range of 350 C for a period of from about 30 to about 300 seconds. This etch process removes top surfaces of oxide regions 7 and hence etches back oxide regions 7 into recesses formed between fins 10. At the same time, this etch process removes portions of fins 10 that have been oxidized during the ozonated water treatment. While performing a plasma etch is a possible alternative, it should be noted that a plasma etch and/or bombardment treatment could further damage the exposed surfaces of fins 10, leading to less than ideal results. One skilled in the art will recognize that other etchants could be employed in addition to or in lieu of the above described $NH_xF$/HF mixture.

In some embodiments, a single cycle of ozonated water treatment and etch may be sufficient to etch back oxide regions 7 to a desired height and to remove damaged regions 12. In other embodiments, however, it may be desirable to subject the device to a series of cycles involving ozonated water treatment followed by etch back. Depending upon the device geometry and process parameters, perhaps from 1 to 10 cycles could be employed—although a greater number of cycles is within the contemplated scope of the invention.

FIG. 1h illustrates the structure after an appropriate number of cycles have been performed. Oxide regions 7 have been recessed to a desired level. At the same time, damaged regions 12 (see FIG. 1g) have been either partially or completely removed, leaving fins 10 with more structurally intact surfaces.

An anneal step may also be performed upon completion of the appropriate number of cycles of oxidizing treatment and etch process. One anneal step may be performed or a series of anneal steps could be performed intermediate various cycles. In one embodiment, an $H_2$ anneal is performed, using a concentration of from about 5% to 100% $H_2$ in a $N_2$ carrier at an elevated temperature in the range of from about 600 C to about 1100 C. Depending upon the device geometry and the anneal parameters, the anneal time could range from 30 seconds to 30 minutes in some embodiments. The anneal step may relax the fin material and improve the surface smoothness of fins 10, as is known in the art.

Processing may then continue to form a desired device. For instance, regions of a fin 10 may be doped with an appropriate impurity to form source and drain regions of a MOS transistor. A gate oxide and gate electrode may be formed over a channel region of the fin to complete the MOS device. Because these structures and processes are well known to those skilled in the art, they are not illustrated herein, although the form part of the contemplated embodiments.

One skilled in the art will recognize that the sidewalls of fins 10, once exposed, will also be oxidized during the subsequent oxidizing treatments and etched during the subsequent etch processes. Hence, it may be necessary to adjust the nominal thickness of fins 10 in the design stage to compensate for the slight amount of sidewall etch back that might occur. As an example, the amount of sidewall etch back can be empirically determined or can be modeled and the width of recesses 4 (in which fins 10 are formed) can be adjusted to compensate for the sidewall thinning. Such adjustment can be made as a matter of routine experimentation FIGS. 2a through 2e illustrate yet further embodiments. Where appropriate like or analogous elements are referenced with a common reference numeral in FIGS. 1 (including 1a through 1h) and 2 (including 2a through 2e). Beginning with FIG. 2a, a substrate 2 is illustrated upon which has been formed oxide layer 6. Oxide layer 6 is patterned, using known photolithography and etching techniques for form a series of recesses 14 defining oxide regions 7. Three such recesses are shown in FIG. 2b, although one skilled in the art will recognize that number, placement, and geometry of recesses 14 are matters of design choice.

Figure 2C:
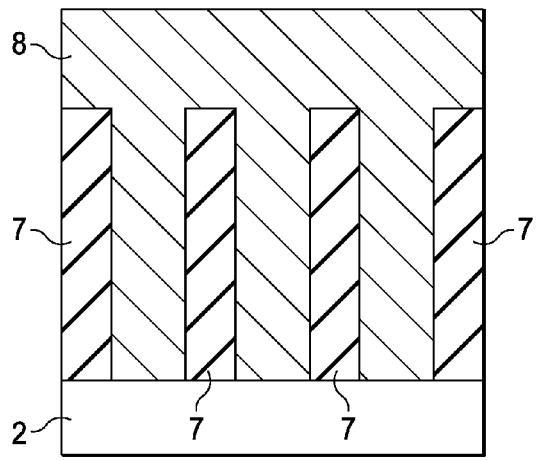
Figure 2D:
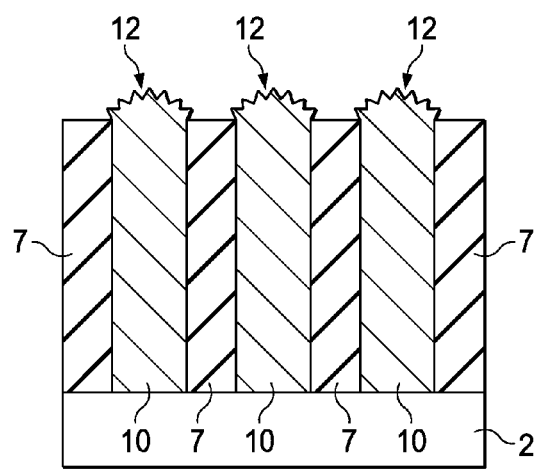
Figure 3:
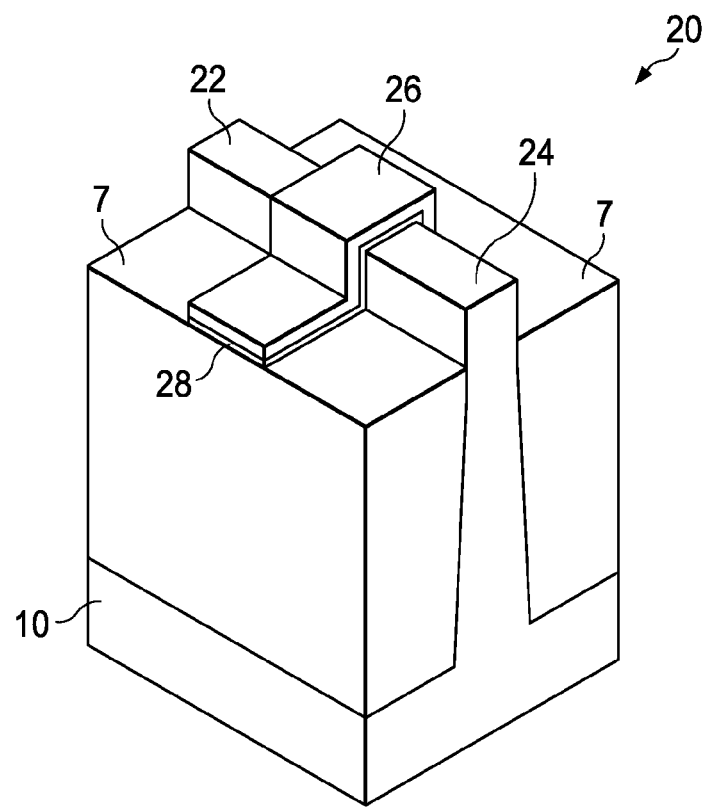
FIG. 3 illustrates an illustrative FinFET device manufactured as an embodiment of the present invention.

As illustrated in FIG. 2c, fin material 8 is epitaxially grown on substrate 2, filling and overfilling recesses 14. Illustrative methods for growing/depositing fin material 8 have been discussed above with regard to FIG. 1f and hence are not repeated herein. As with the previously described embodiments, it is necessary to subject fin material 8 to a CMP process in order to thin the material back to be planar with the tops of recesses 14 formed in oxide 6, i.e. to be co-planar with oxide regions 7. The result of this CMP step, as illustrated in FIG. 2d is the formation of fins 10 having a top surface that is co-planar with oxide 6. An unintended consequence of the CMP process is the formation of damage regions 12 to the tops of fins 10.

Figure 2E:
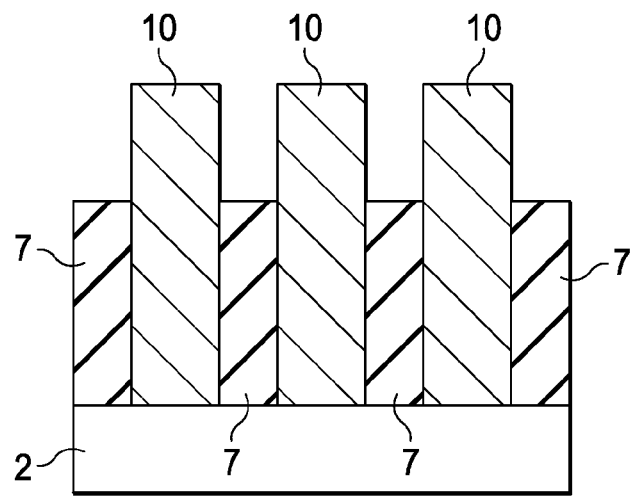

As in the previously described embodiment (described with reference to FIGS. 1a through 1h), it is necessary to thin back or etch back oxide 6. It is desirable obtain a relatively planar top surface of the resulting thinned back oxide regions 7, as was previously discussed. It is further desirable to reduce or eliminate damaged regions 12 from the top surface of fins 10. These goals are accomplished by subjecting the device illustrated in FIG. 2d to one or more cycles of the oxidizing treatment and etch back process discussed above. A result of such processing is illustrated in FIG. 2e, wherein oxide regions 7 are etched back to a desired height and have relatively planar top surfaces. A further result of such processing is that damaged regions 12 of fins 10 have been eliminated or at least substantially reduced.

Processing can then continue, such as in some embodiments, with the formation of source and drain regions in the fins 10, and the formation of gate oxide, gate electrode, etc. over the fins to form complete devices such as MOS transistors, bipolar junction transistors, and the like. FIG. 3 illustrates one such structure, finFET 20. As shown, a finFET transistor 20 can be formed in a fin 10 embedded in oxide regions 7. Source and drain regions 22, 24 are implanted or otherwise formed in fin 10 using techniques known in the art. Gate electrode 26 and gate oxide 28 are formed and patterned over fin 10. The resulting structure 20 provides improved device performance and reliability because of the improved surface characteristics and lessened surface damage to fin 10, as described above.

Although the embodiments and their advantages have been described in detail, it should be understood that various changes, substitutions and alterations can be made herein without departing from the spirit and scope of the embodiments. For example, the precise precursor materials chosen to form the conditioning layer may be modified while remaining within the scope of the embodiments. As another example, it will be readily understood by those skilled in the art that process conditions and materials may be varied while also remaining within the scope of the embodiments.

Moreover, the scope of the present application is not intended to be limited to the particular embodiments of the process, machine, manufacture, composition of matter, means, methods and steps described in the specification. As one of ordinary skill in the art will readily appreciate from the disclosure of the embodiments, processes, machines, manufacture, compositions of matter, means, methods, or steps, presently existing or later to be developed, that perform substantially the same function or achieve substantially the same result as the corresponding embodiments described herein may be utilized according to the embodiments. Accordingly, the appended claims are intended to include within their scope such processes, machines, manufacture, compositions of matter, means, methods, or steps.

What is claimed is:

1. A method for forming a device comprising:
  (a) forming a patterned oxide layer on a substrate, the patterned oxide layer having recesses therein;
  (b) epitaxially growing a semiconductor material on the substrate, the semiconductor material filling and overfilling the recesses;
  (c) planarizing semiconductor material until a top surface of the semiconductor material is substantially planar with a top surface of the patterned oxide layer;
  (d) subjecting the semiconductor material to an oxidizing treatment; and
  (e) subjecting the semiconductor material and the patterned oxide layer to an etch process.

2. The method of claim 1 further comprising performing steps (d) and (e) at least twice.

3. The method of claim 1 wherein the step of epitaxially growing a semiconductor material comprises epitaxially growing an III-V material on the substrate.

4. The method of claim 1 further including in situ doping the semiconductor material during the epitaxially growing step.

5. The method of claim 1 wherein the oxidizing treatment is a treatment selected from the group consisting essentially of an ozonated water treatment and a $H_2O_2$ treatment.

6. The method of claim 1 wherein the etch process is a dry etch process.

7. The method of claim 6 wherein the etch process includes an etch chemistry of selected from the group consisting essentially of $NH_4F$, HF, and combinations thereof.

8. The method of claim 1 wherein the step of forming a patterned oxide layer on a substrate comprises:
  blanket depositing an oxide layer on the substrate; and
  etching recesses in the oxide layer.

9. The method of claim 1 wherein the step of forming a patterned oxide layer on a substrate comprises:
  etching a pattern of recesses in the substrate;
  overfilling the recesses with an oxide layer;
  planarizing the oxide layer to be planar with a top surface of the recesses; and
  etching back the substrate.

10. The method of claim 1 further comprising:
  (f) subjecting the device to an anneal step after step (e).

11. A method of forming a device comprising:
  forming a patterned oxide layer on a semiconductor substrate, the patterned oxide layer exposing regions of the substrate;
  epitaxially growing a fin layer on the exposed regions of the substrate to a height above that of the patterned oxide layer;
  thinning the fin layer back to a level substantially planar with the patterned oxide layer to form at least one fin;
  oxidizing a surface of the at least one fin; and
  etching the patterned oxide layer and the oxidized surface of the at least one fin.

12. The method of claim 11 wherein etching the patterned oxide layer exposes a further surface of the at least one fin, and further comprising:
  oxidizing the further surface of the at least one fin; and
  etching the oxidized further surface of the at least one fin.

13. The method of claim 12 wherein the patterned oxide layer is further etched simultaneously with the etching of the oxidized further surface of the at least one fin.

14. The method of claim 11 wherein oxidizing a surface of the at least one fin comprises exposing the surface of the at least one fin to ozonated water.

15. The method of claim 11 wherein epitaxially growing a fin layer comprises a metal oxide chemical vapor deposition (MOCVD) process.

16. The method of claim 11 further comprising subjecting the device to an $H_2$ anneal.

17. The method of claim 11 wherein the step of thinning the fin layer comprises subjecting the fin layer to a chemical mechanical polish.

18. A method of forming a device comprising:
- forming on a substrate, a patterned oxide having openings formed therein;
- epitaxially growing on the substrate a semiconductor material within the openings;
- thinning back the semiconductor material;
- oxidizing a surface of the semiconductor material; and
- simultaneously etching the oxidized surface of the semiconductor material and the patterned oxide.

19. The method of claim 18 wherein the device is a FinFET device and further comprising:
- doping a first and a second portion of the semiconductor material;
- forming a gate oxide over a third portion of the semiconductor material; and
- forming a gate electrode over the gate oxide.

20. The method of claim 18 wherein thinning back the semiconductor material includes a chemical mechanical polish step.

* * * * *